United States Patent
Verrier et al.

(10) Patent No.: US 6,180,954 B1
(45) Date of Patent: Jan. 30, 2001

(54) DUAL-WALLED EXHAUST TUBING FOR VACUUM PUMP

(75) Inventors: Kevin R. Verrier, Hampton, NH (US); James P. Quill, Wakefield; A. Stuart Denholm, Lincoln, both of MA (US)

(73) Assignee: Eaton Corporation, Cleveland, OH (US)

( * ) Notice: Under 35 U.S.C. 154(b), the term of this patent shall be extended for 0 days.

(21) Appl. No.: 08/862,019

(22) Filed: May 22, 1997

(51) Int. Cl.⁷ .................................................. H05H 15/00
(52) U.S. Cl. .................. 250/492.21; 138/113; 138/114; 285/138
(58) Field of Search ...................... 138/114, 140, 138/113, 149, 112; 285/138; 156/345; 118/715, 723 R

(56) References Cited

U.S. PATENT DOCUMENTS

| | | | |
|---|---|---|---|
| 4,404,992 | * 9/1983 | Sasaki et al. | 138/140 |
| 4,923,584 | 5/1990 | Bramhall, Jr. et al. | 204/298.25 |
| 5,250,137 | 10/1993 | Arami et al. | 204/298.25 |
| 5,498,036 | 3/1996 | Kingsford | 285/138 |
| 5,554,223 | 9/1996 | Imahashi | 118/723 I |
| 5,907,134 | * 5/1999 | Nording et al. | 138/113 |

FOREIGN PATENT DOCUMENTS 0 629 805 A2   12/1994   (EP) .

* cited by examiner

*Primary Examiner*—Thi Dang
(74) *Attorney, Agent, or Firm*—John A. Kastelic

(57) ABSTRACT

A dual walled exhaust assembly (28) is provided for an ion implantation system for connecting system components residing at differing voltage potentials. The assembly comprises a disposable corrugated inner tube (84) connected between inner mounting portions of a first end mount and a second end mount, and a permanent outer tube (82) connected between outer mounting portions of the first and second end mounts. The inner and outer tubes (84, 82) are constructed from polytetrafluoroethylene (PTFE), or some similar dielectric material with appropriate non-flammable properties. The inner corrugated surface of the tube (84) has a plurality of surfaces which are pitched downwardly toward an axis (87) of the inner tube to prevent contaminant accumulation. The corrugated surface also reduces the risk of arcing between the system components residing at differing voltage levels by effectively increasing the length of the ground path that a leakage current would need to traverse across the length of the tube. The outer tube provides a containment mechanism for containing the toxic effluent if the thinner inner wall should puncture, perhaps due to electrical discharge which might still occur as a result of contaminant build-up on the inner surface of the inner tube.

12 Claims, 3 Drawing Sheets

DUAL-WALLED EXHAUST TUBING FOR VACUUM PUMP

FIELD OF THE INVENTION

The present invention relates generally to the field of ion implanters, and more specifically to an improved exhaust tube for use with a vacuum pump in an ion implanter.

BACKGROUND OF THE INVENTION

Ion implantation has become the technology preferred by industry to dope semiconductors with impurities in the large scale manufacture of integrated circuits. A typical ion implanter comprises three sections or subsystems: (i) a terminal including an ion source region which produces the ion beam of desired current and energy, (ii) a target chamber which contains the semiconductor wafer to be implanted by the ion beam, and (iii) a beamline assembly, located between the terminal and the target chamber, which conditions the ion beam output by the ion source and directs the conditioned beam toward the target wafer.

The entire ion implantation process takes place within a vacuum to insure consistent implants and prevent particle contamination. High vacuum pumps are provided for this purpose. Typically, individual high vacuum pumps are provided for the source region, the beamline assembly, and the target chamber. At the region of the target chamber, load locks are used to insert wafers into and withdraw wafers from the target chamber to avoid repeated pressurization and depressurization of the target chamber.

The vacuum systems which are used to evacuate the respective regions of the ion implanter to which they are connected must exhaust the air which is removed from these regions. The exhaust is typically vented to the environment outside of the ion implanter enclosure to accommodate both safety and contamination concerns.

The terminal is necessarily operated at a high voltage to facilitate ion extraction from the source and ion acceleration toward the target chamber. Typically, this voltage is in the range of 80,000 to 100,000 volts (80–100 kilovolts (kV)). The outer enclosure of the ion implanter, however, is electrically grounded for safety reasons. Accordingly, air which has been evacuated from the source region by the source vacuum pump must be vented from the high voltage terminal, through the grounded enclosure, and out to the external environment.

Typically, an exhaust tube connects the source vacuum pump to vent air evacuated from the source region. The exhaust tube extends from the source vacuum pump, through the high voltage terminal housing, and through the grounded outer enclosure to the external environment. The portion of the exhaust tube which extends between the high voltage terminal housing and the grounded outer enclosure must be constructed of a non-conductive, insulating material to prevent electrical contact between the high voltage terminal housing and the grounded outer enclosure.

Over the extended course of operation of the ion implanter, the interior walls of the source vacuum exhaust tube become contaminated with residuals of the source process and other airborne material which has been evacuated during evacuation of the source region. Accumulation of these contaminants, especially hydrocarbons, may eventually compromise the insulative quality of the non-conductive tube, which could result in leakage currents from the terminal to ground, or, worse, high power electrical discharges resulting from arcing between the terminal and the enclosure. To prevent such occurrences, the tube must be either cleaned or replaced to restore system integrity. Because cleaning the tube is time consuming and increases the risk of exposure to the contaminants, the tube is typically replaced.

Accordingly, it is an object of the invention to provide an improved exhaust tube for use in an ion implanter, which is easily maintained to preserve its electrically insulative qualities.

It is a further object of the present invention to provide an exhaust tube assembly for use in an ion implanter which is made economically more practicable by a construction which provides a permanent, reusable outer tube and an inexpensive replaceable and disposable inner tube. The inner tube provides means to contain contaminants and is of a corrugated configuration so as to provide an elongated path for electrical leakage, or flashover, thereby extending the time between maintenance (replacement) intervals as compared to an uncorrugated configuration.

It is still a further object of the present invention to provide an exhaust tube assembly having a dual walled construction which facilitates maintenance of the integrity of its electrical non-conductivity, and which minimizes contaminant collection therein.

It is still a further object of the present invention to provide a dual walled exhaust tube assembly, wherein a corrugated inner contamination containment tube is relatively thin-walled as compared to a more robust permanent outer tube which provides effective containment in the event of a puncture of the inner tube.

SUMMARY OF THE INVENTION

A dual walled exhaust assembly is provided for an ion implantation system for connecting system components residing at differing voltage potentials. The assembly comprises an inner tube having a first end connected to an inner mounting portion of a first end mount and a second end connected to an inner mounting portion of a second end mount; and an outer tube having a first end connected to an outer mounting portion of the first end mount and a second end connected to an outer mounting portion of the second end mount.

In certain embodiments of the invention, the inner and outer tubes are preferably constructed from polytetrafluoroethylene. The inner corrugated surface of the tube may also be provided with a plurality of surfaces which are pitched downwardly toward an axis of the inner tube to prevent contaminant accumulation. The corrugated surface also reduces the risk of arcing between the system components residing at differing voltage levels by effectively increasing the length of the ground path that a leakage current would need to traverse from a high voltage source end of the tube to a grounded end. The outer tube provides a containment mechanism for containing airborne material which may be released if the inner tube integrity is breached due to arcing which might still occur as a result of contaminant build-up on the inner surface of the inner tube. The outer tube also functions to maintain the alignment and position of the inner tube contained therein. Proper positioning and alignment is important to insure that contaminants are continually discharged from the inner tube, and to prevent unnecessary movement and resultant distortion or deterioration of the inner tube as it ages.

Detailed Description of a Preferred Embodiment

Figure 1:
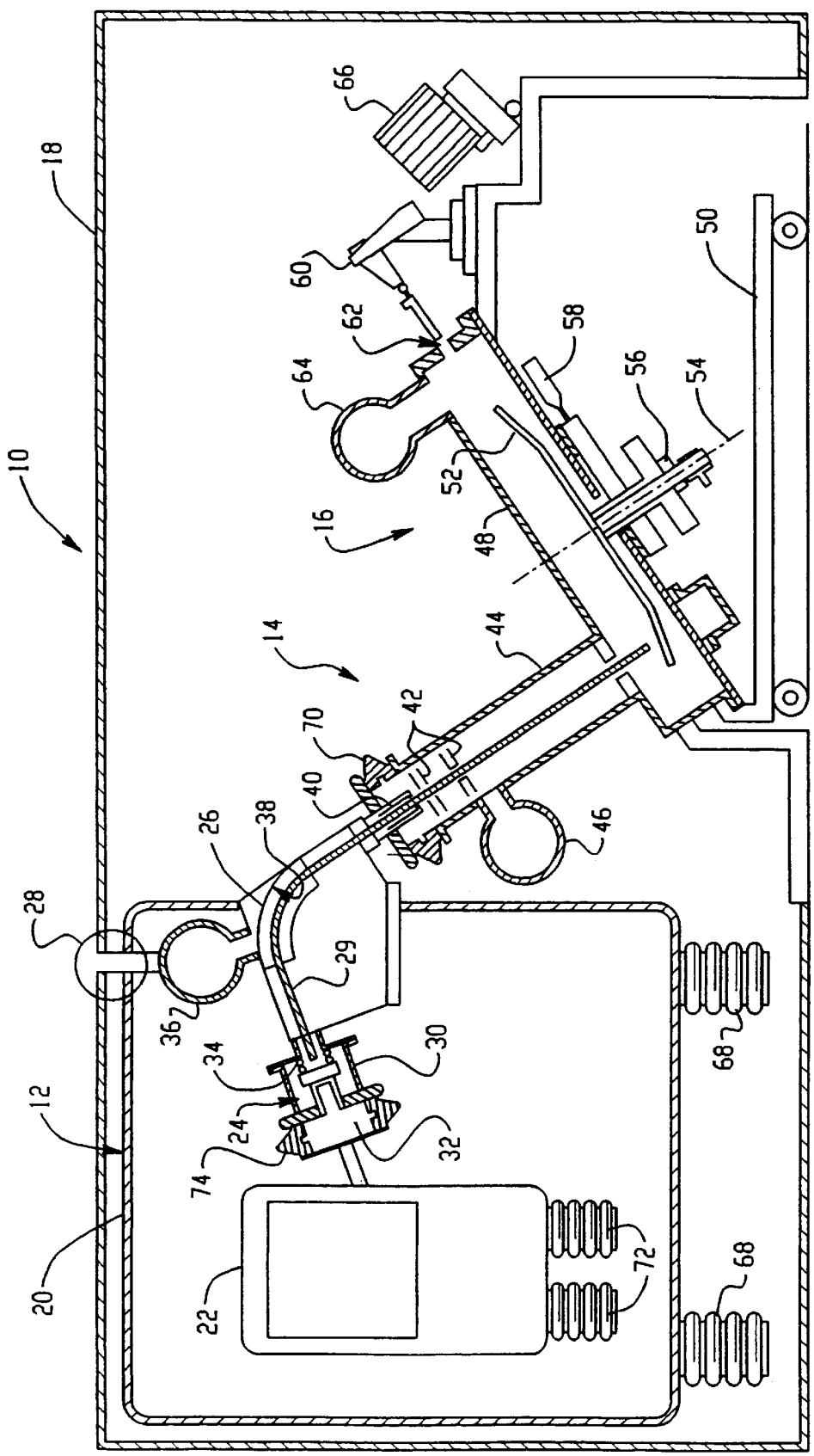
FIG. 1 is a side sectional view of an ion implantation system into which is incorporated one embodiment of the improved vacuum exhaust tube assembly constructed according to the principles of the present invention.

Referring now to the drawings, FIG. 1 discloses an ion implanter, generally designated 10, which comprises a terminal 12, a beamline assembly 14, and a target or end station 16, all of which are contained within an electrically grounded outer enclosure 18. The terminal includes a high voltage housing 20 which contains a gas box 22, an ion source 24, and a mass analyzing magnet 26. An exhaust tube assembly 28, constructed according to the principles of the present invention, connects the high voltage housing 20 to the outer enclosure 18, as further explained below.

An ion beam 29 emanating from the ion source 22 follows a controlled travel path that exits the terminal 12 through the mass analyzing magnet, then passes through the beamline assembly 14 to the end station 16 where it is implanted into semiconductor wafers residing therein. Along the controlled travel path the ion beam 29 is shaped, evaluated, and accelerated to a desired implant energy.

The ion source 24 comprises a housing 30 which defines a plasma chamber 32, and an ion extractor assembly 34. Ionizable dopant gas, which is obtained either directly as a compressed gas from gas box 22 or indirectly by vaporizing a solid dopant material, is injected into the plasma chamber 32. Typical source elements are boron (B), phosphorous (P), gallium (Ga), indium (In), antimony (Sb), and arsenic (As). Most of these source elements are provided in solid form, except boron, which is typically provided in the form of gaseous boron trifluoride or diborane from gas box 22.

Energy is imparted to the ionizable dopant gas to generate ions within the plasma chamber 32. Generally, positive ions are generated, although the present invention is applicable to systems wherein negative ions are generated by the source. The positive ions are extracted through a slit in the plasma chamber 32 by the ion extractor assembly 34 which comprises a plurality of electrodes, charged with negative potential voltages, increasing in magnitude as the distance from the plasma chamber slit increases. Accordingly, the ion extractor assembly functions to extract the ion beam 29 of positive ions from the plasma chamber and accelerate the extracted ions into the mass analysis magnet 26.

The mass analyzing magnet 26 functions to pass only ions of an appropriate charge-to-mass ratio to the beamline assembly 14. The mass analysis magnet 26 is required because the ion source 24, in addition to generating ions of appropriate charge-to-mass ratio, also generates ions of greater or lesser charge-to-mass ratio than that desired. Ions of inappropriate charge-to-mass ratios are not suitable for implantation into a wafer. The mass analysis magnet 26 includes a curved beam path which is defined by an aluminum beam guide 38, evacuation of which is provided by a source region vacuum pump 36. The ion beam 29 which propagates along this path is affected by the magnetic field generated by the mass analysis magnet 26.

After leaving the magnet 26, the ion beam 29 is focused by a quadrupole lens 40 which deflects the ions in the beam in mutually orthogonal planes. Ions in the beam which are not sufficiently deflected and focused by the quadrupole lens 40 exit from the ion beam and never reach the end station 16. Ions remaining in the beam are accelerated or decelerated by acceleration/deceleration electrodes 42 to a desired final implantation energy, through an evacuated tube 44 and toward the end station 16. Evacuation of the tube 44 is provided by beamline region vacuum pump 46.

The end station 16 comprises a target chamber 48 which is mounted to a movable pedestal 50 to permit alignment of the target chamber with the ion beam. The ion beam impinges upon one or more semiconductor wafers supported on a wafer support 52 which is mounted for rotation about an axis 54 by motor 56. A linear drive mechanism 58 causes the wafer support 52 to be indexed back and forth in the chamber 48.

Semiconductor wafers are inserted into the target chamber 48 by a robotic arm 60 through a vacuum port 62. The chamber 48 is evacuated by target chamber vacuum pump 64 to a low pressure generally equal to the pressure within the evacuated tube 44. (Vacuum pumps 36, 46, and 64 are also commonly known as "roughing pumps".) The robotic arm 60 shuttles the wafers between a cassette 66 and the target chamber 48. Mechanisms for accomplishing this transfer are well known in the art.

Operation of the ion implantation system 10 of FIG. 1 relies upon two high voltage power supplies (not shown), each of which is capable of outputting 80 kV to 100 kV. A first high voltage power source provides power for the acceleration/deceleration electrodes 42, which operate at up to 100 kV with respect to the potential of the system enclosure 18 (earth ground). This same 100 kV potential is also experienced by the terminal high voltage housing 20, which operates at the same voltage as the acceleration/deceleration electrodes. Isolation bushings 68 provide electrical isolation between the system enclosure (earth ground) and the terminal high voltage housing 20 (100 kV). Isolation bushing 70, which isolates the evacuated tube 44 in the beamline assembly from the acceleration/deceleration electrodes 42, serves a similar purpose.

A second high voltage power source provides power for the extraction electrodes 34, which also operate at up to 100 kV with respect to the acceleration/deceleration electrodes 42. Accordingly, the gas box 22 and ion source 24 operate at up to 200 kV with respect to earth ground. Isolation bushings 72 provide electrical isolation between the terminal high voltage housing 20 (100 kV potential) and the gas box/ion source (200 kV potential). Isolation bushing 74, which isolates the extraction electrodes 34 from the gas box/ion source, serves a similar purpose.

Source region vacuum pump 36 is connected to the exhaust tube assembly 28 which extends from the pump 36 through both the terminal high voltage housing 20 and the grounded system enclosure 18. Exhaust tubes are not shown for the beamline region vacuum pump 46 and the target chamber vacuum pump 64, because, although the inventive exhaust tube assembly may be used with such pumps, it has particular applications in high voltage environments, such as that in which the source region vacuum pump operates.

Figure 2:
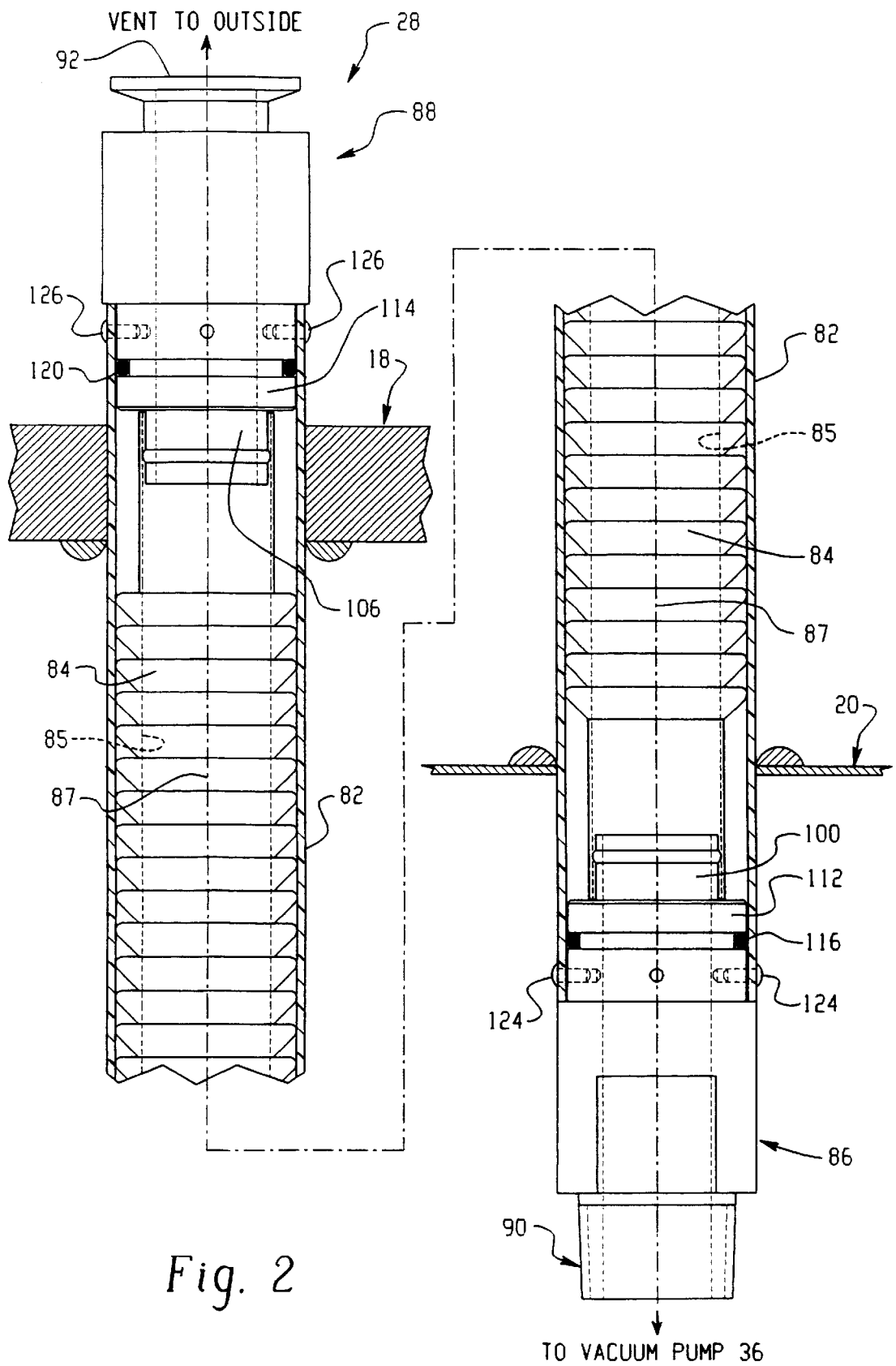
FIG. 2 is an enlarged, partial breakaway view of the portion of FIG. 1 showing the improved vacuum exhaust tube assembly.

The exhaust tube assembly 28 is shown more clearly in FIG. 2, as connected between the grounded enclosure 18 and the high voltage housing 20. The exhaust tube assembly 28 comprises an outer cylindrical tube 82 surrounding an inner corrugated tube 84 (shown through breakaway portions of FIG. 2). The inner corrugated tube 84 provides a passageway 85 which extends the entire length of the exhaust tube assembly 28 along an axis 87. In the preferred embodiment, the outer cylindrical tube 82 and the inner cylindrical tube 84 are constructed of polytetra-fluoroethylene (PTFE), or Teflon®, which is a registered trademark of the E.I. DuPont de Nemours Co. The PTFE is electrically non-conductive and maintains its structural integrity under heated conditions. Materials other than PTFE may be used in the construction of tubes 82, 84, as long as they possess similar structural and electrical conductivity characteristics.

The exhaust tube assembly 28 is provided with lower and upper end mounts 86 and 88, respectively, which are preferably made of metal (e.g., stainless steel) as they need not be electrically insulating. Lower end mount 86 connects the exhaust tube assembly 28 to the source region vacuum pump 36 (by means of additional venting structure (e.g., tubing) not shown) and upper end mount 88 connects the exhaust tube assembly 28 to the external environment (again by means of additional tubing not shown). Lower end mount 86 is provided with a tapered connection 90 and upper end mount 88 is provided with a flange 92 for these connections.

Figure 3:
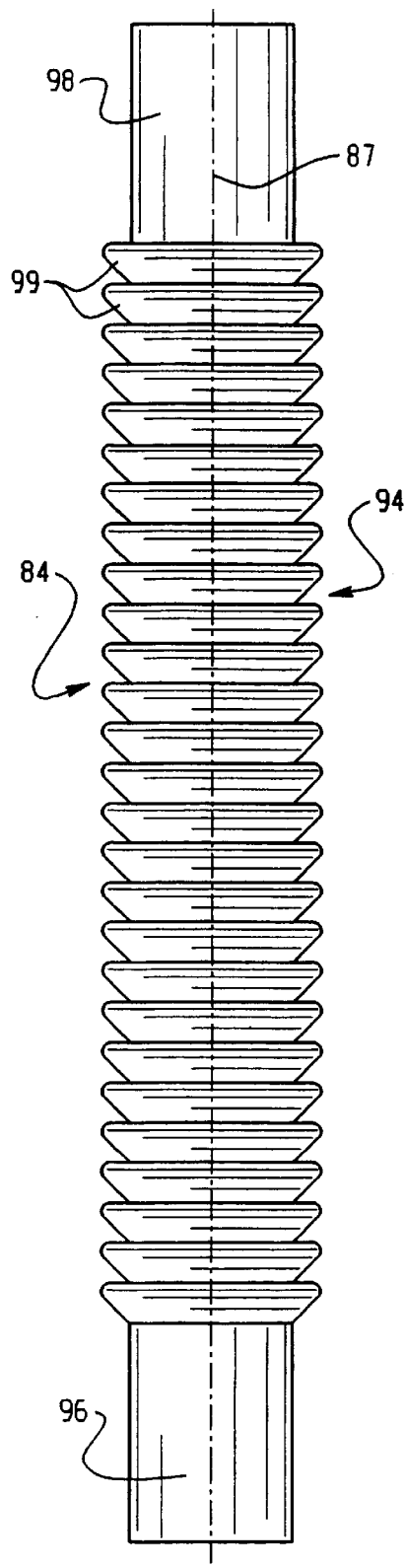
FIG. 3 is a side sectional view of the inner corrugated tube of the vacuum exhaust tube assembly shown in FIG. 2.
Figure 4:
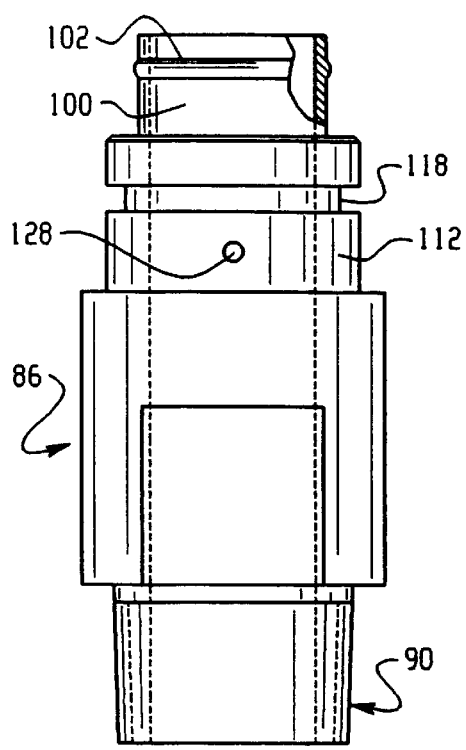
FIG. 4 is a side sectional view of the lower end mount of the vacuum exhaust tube assembly shown in FIG. 2.
Figure 5:
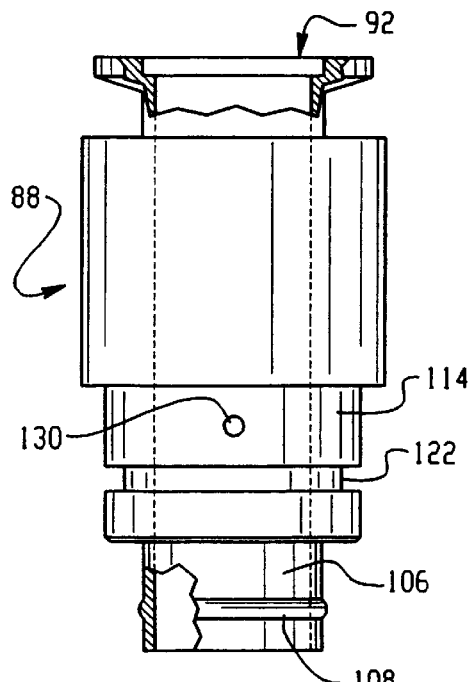
FIG. 5 is a side sectional view of the upper end mount of the vacuum exhaust tube assembly shown in FIG. 2.

FIGS. 3, 4 and 5, respectively, show in greater detail the inner corrugated tube 84, the lower end mount 86, and the upper end mount 88, respectively. The inner corrugated tube 84 includes a corrugated midsection 94, a lower end section 96 and an upper end section 98. The individual undulations 99 which form the corrugated inner surface of the corrugated tube 84 are pitched downwardly toward axis 87 so that no ledges or depressions are formed in the inner surface, which would otherwise serve to promote contaminant accumulation. In addition, a collection bowl may be incorporated into the venting structure below the tube assembly 28 to collect contaminants which fall from the passageway 85.

The undulations provided by the corrugated inner surface of the corrugated tube also function to increase the length of the ground path that a leakage current would need to traverse to leak from the high voltage (lower) end of the tube 84 to the grounded (upper) end. Increasing the ground path length is important because current leakage which effectively traverses the entire length of the ground path typically precedes arcing between the high voltage housing 20 and the grounded enclosure 18, a condition that would typically shut down the ion implantation system 10. Thus, the corrugated inner tube 84 effectively decreases the risk of arcing between the housing 20 and the enclosure 18.

The lower and upper end mounts 86 and 88 are provided with stepped portions on which are mounted to the inner corrugated tube 84 and the outer cylindrical tube 82 to complete the vacuum exhaust tube assembly 28. As shown, with reference to FIGS. 2–5, the lower end section 96 of the inner corrugated tube 84 is slipped over an inner stepped portion 100 of the lower end mount 86. The inner stepped portion 100 is provided with a circumferential ridge 102 which facilitates a snug fit between the inner corrugated tube 84 and the lower end mount 86. In this manner, a fastenerless connection is made between the inner corrugated tube 84 and the lower end mount 86. Because the PTFE material from which the tube 84 is constructed tends to shrink upon heating, the fit obtained between the tube 84 and the lower end mount 86 is improved during operation of the ion implantation system 10.

Similarly, the upper end section 98 of the inner corrugated tube 84 is slipped over an inner stepped portion 106 of the upper end mount 88. The inner stepped portion 106 is provided with a circumferential ridge 108 which facilitates a snug fastenerless fit between the inner corrugated tube 84 and the upper end mount 88. In this manner, the inner corrugated tube is made removably detachable from both end mounts.

The outer cylindrical tube 82 surrounds the entirety of the inner corrugated tube 84 and has ends which slip over outer stepped portions 112 and 114 of the lower and upper end mounts 86 and 88, respectively. O-Ring 116 resides in circumferential channel 118 of the outer stepped portion 112 to maintain an airtight seal between the outer cylindrical tube 82 and the lower end mount 86. Similarly, O-Ring 120 resides in circumferential channel 122 of the outer stepped portion 114 to maintain an airtight seal between the outer cylindrical tube 82 and the upper end mount 88. Screws 124 and 126 fixedly secure the position of the outer cylindrical tube 82 over the outer stepped portions of the lower and upper end mounts, respectively. Tapped holes 128 and 130 are provided for the screws 124 and 126, respectively.

Although the disclosed embodiment of the invention includes the upper and lower end mounts 86 and 88, it is contemplated that the present invention may be practiced with or without the use of separate end mounts. The dual walled construction of an inner tube surrounded by an outer tube may be preserved without using end mounts, for example, by providing means for the inner and outer tubes to be attached directly to each other. One such means is a snap fit configuration in which one portion of one of the inner or outer tubes fits into another portion of the other of the inner or outer tubes, without using separate fasteners. Alternatively, in an embodiment in which separate end mounts are not used, fasteners may be utilized to directly fasten the inner and outer tubes together. As such, the term "end mounts" as used herein shall mean any structure which connects to either end of an assembly comprising the inner and outer tubes 82, 84.

The outer cylindrical tube 82 protects and supports the shape and length of the inner corrugated tube 84, as well as provides a robustness to the assembly 28 which is not achievable using only the inner corrugated tube. In the preferred embodiment, the outer cylindrical tube has walls which are thicker than those of the inner corrugated tube. In addition, by surrounding the inner tube, the outer tube provides a containment mechanism for containing the toxic effluent if the thinner inner tube should be punctured, perhaps due to electrical discharge which might occur as a result of contaminant build-up on the inner surface of the inner tube. The O-rings 116 and 120 support this containment mechanism.

After extended operation of the ion implantation system 10, the inner corrugated tube 84 may become contaminated with contaminants exhausted by the source region vacuum pump 36. The inventive exhaust tube assembly 28, by providing the dual walled construction of the inner corrugated tube 84 surrounded by the outer cylindrical tube 82, permits economical reconstruction of the assembly to maintain the integrity of its electrical non-conductivity. Specifically, the entire exhaust tube assembly 28 is first removed from its position between the high voltage housing 20 and the grounded enclosure 18. The outer cylindrical tube 82 is removed from end mounts 86 and 88 be loosening set screws 124 and 126. The inner corrugated tube 84 is removed from the end mounts 86 and 88 by merely forcibly detaching the tube from the end mounts. A new replacement inner corrugated tube 84 may then be installed onto the end mounts. The outer tube 82 may the be reattached to the end mounts, and the entire refurbished assembly 28 may be reinstalled into the system 10.

Accordingly, a preferred embodiment of an improved vacuum pump exhaust tube assembly for use in an ion implanter has been described, as well as a method for economically reconstructing the assembly to maintain the integrity of its electrical non-conductivity. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What we claim is:

1. A ion implantation system, comprising
   a terminal, including a high voltage housing which at least partially houses (i) an ion source for producing an ion beam, (ii) a beamguide for transporting the ion beam, and (iii) a vacuum pump for evacuating the beamguide;
   an electrically grounded enclosure surrounding said high voltage housing; and
   an electrically non-conductive exhaust tube assembly connected between the electrically grounded enclosure and said high voltage housing, said assembly comprising: (i) a first end mount; (ii) a second end mount; (iii) an inner tube having a first end connected to an inner mounting portion of said first end mount and a second end connected to an inner mounting portion of said second end mount; and (iv) an outer tube surrounding said inner tube and having a first end connected to an outer mounting portion of said first end mount and a second end connected to an outer mounting portion of said second end mount, wherein said inner tube has an inner corrugated surface extending over a substantial portion of its length, said corrugated surface having a plurality of surfaces which are pitched downwardly toward an axis of said inner tube.

2. The ion implantation system of claim 1, wherein each of said inner and outer tubes is constructed from polytetrafluoroethylene.

3. The ion implantation system of claim 1, wherein said inner corrugated tube is connected to said first and second end mounts by means of a fastenerless connection mechanism.

4. The ion implantation system of claim 1, further comprising a first sealing member disposed between said first end of said outer tube and said outer mounting portion of said first end mount, and a second sealing member disposed between said second end of said outer tube and said outer mounting portion of said second end mount.

5. A dual walled exhaust assembly, comprising: a first end mount; a second end mount; an inner tube having a first end connected to an inner mounting portion of said first end mount and a second end connected to an inner mounting portion of said second end mount; and an outer tube surrounding said inner tube and having a first end connected to an outer mounting portion of said first end mount and a second end connected to an outer mounting portion of said second end mount, wherein said inner tube has an inner corrugated surface extending over a substantial portion of its length, said corrugated surface having a plurality of surfaces which are pitched downwardly toward an axis of said inner tube.

6. The dual walled exhaust assembly of claim 2, wherein each of said inner and outer tubes is comprised of an electrically non-conductive material.

7. The dual walled exhaust assembly of claim 3, wherein each of said inner and outer tubes is constructed from polytetrafluoroethylene.

8. The dual walled exhaust assembly of claim 3, wherein said inner corrugated tube is connected to said first and second end mounts by means of a fastenerless connection mechanism.

9. The dual walled exhaust assembly of claim 3, further comprising a first sealing member disposed between said first end of said outer tube and said outer mounting portion of said first end mount, and a second sealing member disposed between said second end of said outer tube and said outer mounting portion of said second end mount.

10. In combination, a vacuum exhaust device comprising an inner exhaust tube surrounded by an outer exhaust tube, said inner and outer exhaust tubes fixedly coupled to each other, said combination having first and second ends attachable to venting structure, wherein said inner tube has an inner corrugated surface for a substantial portion of its length, said corrugated surface having a plurality of surfaces which are pitched downwardly toward an axis of said inner tube.

11. The combination of claim 8, wherein each of said inner and outer tubes is comprised of an electrically non-conductive material.

12. The combination of claim 9, wherein each of said inner and outer tubes is constructed from polytetrafluoroethylene.

* * * * *